and second pre-

(12) United States Patent
Yoo et al.

(10) Patent No.: US 12,249,571 B2
(45) Date of Patent: Mar. 11, 2025

(54) PRE-MOLD SUBSTRATE AND METHOD OF MANUFACTURING PRE-MOLD SUBSTRATE

(71) Applicant: HAESUNG DS CO., LTD., Changwon-si (KR)

(72) Inventors: Kwang Jae Yoo, Changwon-si (KR); Jong Hoe Ku, Gimhae-si (KR); In Seob Bae, Changwon-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 0 days.

(21) Appl. No.: 17/428,258

(22) PCT Filed: Jun. 24, 2021

(86) PCT No.: PCT/KR2021/007958
§ 371 (c)(1),
(2) Date: Aug. 3, 2021

(87) PCT Pub. No.: WO2022/270654
PCT Pub. Date: Dec. 29, 2022

(65) Prior Publication Data
US 2024/0038652 A1    Feb. 1, 2024

(30) Foreign Application Priority Data

Jun. 21, 2021  (KR) .................. 10-2021-0080404

(51) Int. Cl.
*H01L 23/498*          (2006.01)
*H01L 21/3213*         (2006.01)
(Continued)

(52) U.S. Cl.
CPC .. *H01L 23/49861* (2013.01); *H01L 21/32139* (2013.01); *H01L 23/3121* (2013.01);
(Continued)

(58) Field of Classification Search
CPC ........... H01L 23/49861; H01L 23/3121; H01L 23/482; H01L 23/49838; H01L 23/49894; H01L 21/32139
See application file for complete search history.

(56) References Cited

U.S. PATENT DOCUMENTS 8,703,598 B2    4/2014  Maniwa et al.
9,460,986 B2   10/2016  Kang et al.
(Continued)

FOREIGN PATENT DOCUMENTS

JP    H09321173 A    12/1997
JP    2002043699 A    2/2002
(Continued)

OTHER PUBLICATIONS

Taiwan Intellectual Property Office, First Office Action dated Feb. 24, 2022, pp. 1-7.
(Continued)

*Primary Examiner* — Victor A Mandala
*Assistant Examiner* — Lawrence C Tynes, Jr.
(74) *Attorney, Agent, or Firm* — Schwabe Williamson & Wyatt

(57) ABSTRACT

According to an aspect of the present disclosure, there is provided a pre-mold substrate including an electroconductive base member, which includes a first pre-mold groove formed in a bottom surface and a second pre-mold groove formed in a top surface and constitutes a circuit pattern; a first pre-mold resin disposed in the first pre-mold groove; and a second pre-mold resin disposed in the second pre-mold groove.

16 Claims, 6 Drawing Sheets

(51) Int. Cl.
*H01L 23/31* (2006.01)
*H01L 23/482* (2006.01)

(52) U.S. Cl.
CPC ...... *H01L 23/482* (2013.01); *H01L 23/49838* (2013.01); *H01L 23/49894* (2013.01)

(56) References Cited

U.S. PATENT DOCUMENTS

| | | | |
|---|---|---|---|
| 10,910,299 B2 | 2/2021 | Bae et al. | |
| 2002/0011348 A1 | 1/2002 | Takeuchi | |
| 2004/0163844 A1 | 8/2004 | Takeuchi | |
| 2013/0020688 A1 | 1/2013 | Pan et al. | |
| 2017/0236772 A1* | 8/2017 | Yamagami | H01L 21/78 |
| 2019/0088578 A1* | 3/2019 | Kaneko | H01L 23/49558 |
| 2019/0259634 A1* | 8/2019 | Wang | H01L 21/561 |
| 2020/0135632 A1* | 4/2020 | Mishra | H01L 24/48 |
| 2020/0214145 A1* | 7/2020 | Lin | H05K 3/3457 |
| 2021/0036196 A1 | 2/2021 | Liang et al. | |
| 2021/0335695 A1* | 10/2021 | Matsumoto | H01L 23/49582 |

FOREIGN PATENT DOCUMENTS

| | | |
|---|---|---|
| JP | 2010283055 A | 12/2010 |
| JP | 2016066790 A | 4/2016 |
| KR | 10-2011-0124482 A | 11/2011 |
| KR | 10-2012-0050711 A | 5/2012 |
| KR | 20120050711 A * | 5/2012 |
| KR | 10-2016-0021304 A | 2/2016 |
| KR | 10-2017-0008088 A | 1/2017 |
| WO | 2011013673 A | 2/2011 |

OTHER PUBLICATIONS

Japanese Patent Office; JP App. No. 2021-562376; Notice of Reasons for Refusal (translation); Aug. 18, 2023, pp. 1-8.
Japanese Patent Office; JP App. No. 2021-562376; Notice of Reasons for Refusal (translation); Feb. 14, 2024, pp. 1-4.
Japanese Patent Office; JP App. No. 2021-562376; Decision of Dismissal of Amendment (translation); Jul. 22, 2024 pp. 1-4.

* cited by examiner

PRE-MOLD SUBSTRATE AND METHOD OF MANUFACTURING PRE-MOLD SUBSTRATE

CROSS-REFERENCE TO RELATED APPLICATIONS

The present Application is a National Phase entry under 35 U.S.C. § 371 of International Application No. PCT/KR2021/007958, filed on Jun. 24, 2021, entitled "PRE-MOLD SUBSTRATE AND METHOD OF MANUFACTURING PRE-MOLD SUBSTRATE", which claims priority to KR Application 10-2021-0080404, filed on Jun. 21, 2021, in the Republic of Korea, the entire contents of these applications are incorporated herein by reference in their entirety.

TECHNICAL FIELD

The present disclosure relates to a pre-mold substrate.

BACKGROUND ART

As electronic devices become smaller, lighter, faster, and higher in capacity, technologies related to substrates and lead frames used in the electronic devices are being dramatically developed.

From among substrates or lead frames, there is a pre-mold substrate or a pre-mold lead frame in which a portion of a mold resin is arranged. Because a portion of a mold resin is arranged in a pre-mold substrate or a pre-mold lead frame in advance before a semiconductor chip is mounted, a semiconductor package manufacturing process may be shortened.

Korea Patent Open Publication No. 10-2016-0021304 discloses a method of manufacturing a lead frame in which a pre-mold resin is disposed on the bottom surface of the lead frame.

DESCRIPTION OF EMBODIMENTS

Technical Problem

The present disclosure provides an enhanced pre-mold substrate and a method of manufacturing the pre-mold substrate.

Solution to Problem

According to an aspect of the present disclosure, a pre-mold substrate includes an electroconductive base member, which includes a first pre-mold groove formed in a bottom surface and a second pre-mold groove formed in a top surface and constitutes a circuit pattern; a first pre-mold resin disposed in the first pre-mold groove; and a second pre-mold resin disposed in the second pre-mold groove.

According to another aspect of the present disclosure, a method of manufacturing a pre-mold substrate includes preparing an electroconductive base member; forming a first pre-mold groove by processing a bottom surface of the base member; disposing a first pre-mold resin in the first pre-mold groove; forming a second pre-mold groove by processing a top surface of the base member; and disposing a second pre-mold resin in the second pre-mold groove.

Advantageous Effects of Disclosure

According to an aspect of the present disclosure, because first and second pre-mold resins are arranged on the bottom surface side and the top surface side of a base member, respectively, warpage of a pre-mold substrate may be prevented.

BEST MODE

Figure 1:
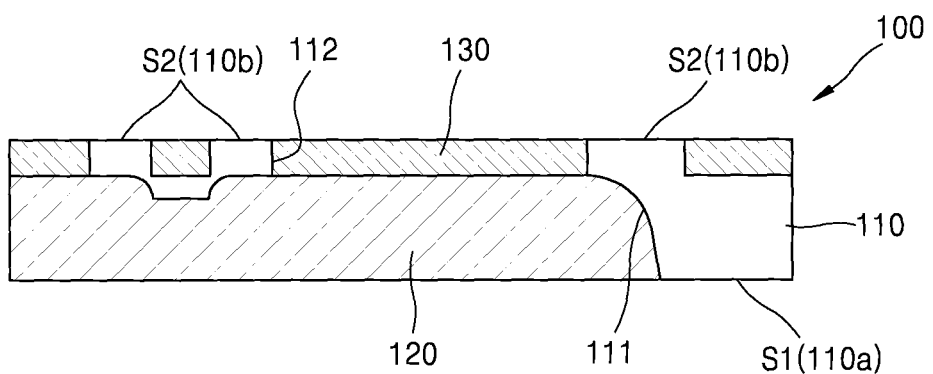
FIG. 1 is a cross-sectional view of a pre-mold substrate according to an embodiment of the present disclosure.

According to an aspect of the present disclosure, a pre-mold substrate includes an electroconductive base member, which includes a first pre-mold groove formed in a bottom surface and a second pre-mold groove formed in a top surface and constitutes a circuit pattern; a first pre-mold resin disposed in the first pre-mold groove; and a second pre-mold resin disposed in the second pre-mold groove.

Here, the first pre-mold resin and the second pre-mold resin may include a resin of the same type.

Here, a solder cream may be arranged at least portions of exposed portions of the base member not covered by the first pre-mold resin and the second pre-mold resin.

According to another aspect of the present disclosure, a method of manufacturing a pre-mold substrate includes preparing an electroconductive base member; forming a first pre-mold groove by processing a bottom surface of the base member; disposing a first pre-mold resin in the first pre-mold groove; forming a second pre-mold groove by processing a top surface of the base member; and disposing a second pre-mold resin in the second pre-mold groove.

Here, the first pre-mold resin and the second pre-mold resin may include a resin of the same type.

Here, in the forming of the first pre-mold groove, the bottom surface of the base member may be processed through etching.

Here, the etching may be performed by disposing a dry film resist including a photosensitive material on the bottom surface of the base member and forming a resist pattern from the dry film resist.

Here, in the forming of the second pre-mold groove, the top surface of the base member may be processed through etching.

Here, the etching may be performed by disposing a dry film resist including a photosensitive material on the top surface of the base member and forming a resist pattern from the dry film resist.

Here, the method may further include arranging a solder cream at least portions of exposed portions of the base member not covered by the first pre-mold resin and the second pre-mold resin.

MODE OF DISCLOSURE

Hereinafter, the present disclosure will be described in detail with reference to the accompanying drawings. In addition, in the present specification and the drawings, repeated descriptions of components having substantially the same configuration are omitted by using the same reference numerals, and there may be exaggerations for sizes, lengths, etc. in the drawings to help understanding.

The present disclosure will be apparent to embodiments described below in detail with the accompanying drawings. The present disclosure may, however, be embodied in many different forms and should not be construed as limited to the exemplary embodiments set forth herein. Rather, these embodiments are provided so that the present disclosure will be thorough and complete, and will fully convey the scope of the present disclosure to one of ordinary skill in the art. The present disclosure shall be defined by the scope of the claims.

On the other hand, the terms used herein are intended to illustrate embodiments and are not intended to limit the present disclosure. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. In this specification, the terms like a top surface, bottom surface, up, down, left, right, first, second, etc. may be used to describe various components, but the components should not be limited by terms. In other words, the terms are not intended to indicate an absolute direction or position, but are used only for the purpose of distinguishing one component from other components.

FIG. 1 is a cross-sectional view of a pre-mold substrate according to an embodiment of the present disclosure.

As shown in FIG. 1, a pre-mold substrate 100 according to an embodiment of the present disclosure includes a base member 110, a first pre-mold resin 120, and a second pre-mold resin 130.

The base member 110 constitutes a portion of the pre-mold substrate 100 and constitutes a circuit pattern after etching.

There is no particular limitation of the base member 110 as long as the base member 110 includes an electroconductive material. Materials constituting the base member 110 may include various materials, e.g., a single material like Cu and Fe, a copper alloy like Cu—Sn, Cu—Zr, Cu—Fe, and Cu—Zn, and an iron alloy like Fe—Ni and Fe—Ni—Co. Also, a commercial lead frame material may be applied as a material constituting the base member 110.

A first pre-mold groove 111 is formed in the bottom surface of the base member 110, and a second pre-mold groove 112 is formed in the top surface of the base member 110.

Exposed portions S1 and S2 of the base member 110 are not covered by the first pre-mold resin 120 and the second pre-mold resin 130, and the exposed portions S1 and S2 serve as terminals for electrical connection to a semiconductor chip or an external circuit board.

The first pre-mold resin 120 is disposed in the first pre-mold groove 111.

The first pre-mold resin 120 constitutes the pre-mold substrate 100 together with the base member 110, wherein the first pre-mold resin 120 protects the base member 110.

The first pre-mold resin 120 is an electrically insulating resin. The first pre-mold resin 120 may be a thermoplastic resin or a thermosetting resin and may include silica from 80% to 90% or more to minimize heat expansion. The first pre-mold resin 120 may be formed by using a liquid resin material or solid tape including resin ingredients.

Furthermore, the first pre-mold resin 120 includes an appropriate material to prevent spreading of a solder cream arranged on the exposed portions S1 and S2 of the base member 110, but the present disclosure is not limited thereto.

The second pre-mold resin 130 is disposed in the second pre-mold groove 112.

The second pre-mold resin 130 is an electrically insulating resin. The second pre-mold resin 130 may be a thermoplastic resin or a thermosetting resin and may include silica from 80% to 90% or more to minimize heat expansion. The second pre-mold resin 130 may be formed by using a liquid resin material or solid tape including resin ingredients.

Furthermore, the second pre-mold resin 130 includes an appropriate material to prevent spreading of a solder cream arranged on the exposed portions S1 and S2 of the base member 110, but the present disclosure is not limited thereto.

According to the present embodiment, the first pre-mold resin 120 and the second pre-mold resin 130 include a resin of the same type. In this case, because resins arranged on both surface sides of the base member 110 are of the same type, there is no difference between thermal expansion coefficients of both surface sides of the pre-mold substrate 100, and thus, warpage of the pre-mold substrate 100 may be more effectively prevented.

According to the present embodiment, the first pre-mold resin 120 and the second pre-mold resin 130 include a resin of the same type, but the present disclosure is not limited thereto. In other words, according to the present disclosure, the first pre-mold resin 120 and the second pre-mold resin 130 may include resins of different types.

Hereinafter, referring to FIGS. 2 to 10, a method of manufacturing the pre-mold substrate 100 according to the present embodiment will be described.

Figure 7:
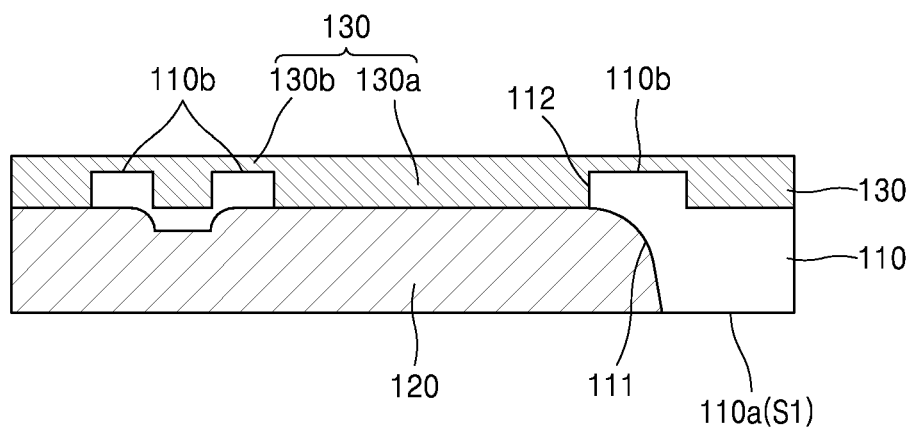
Figure 8:
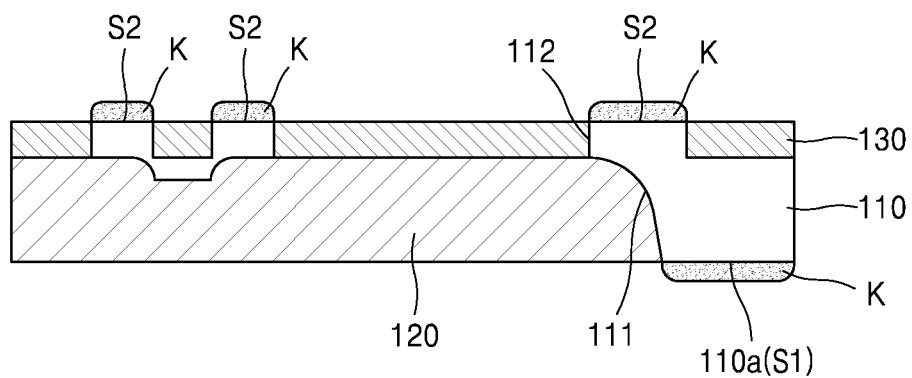
Figure 9:
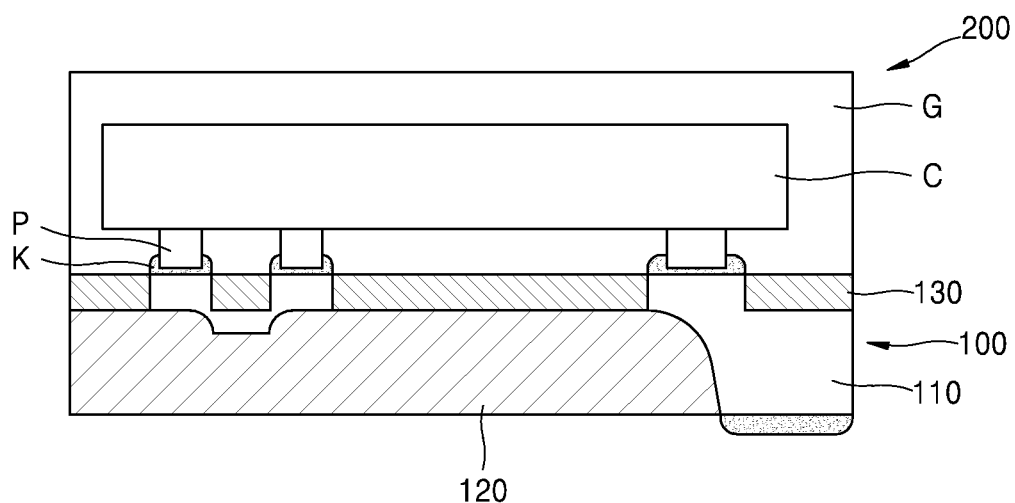
FIG. 9 is a schematic cross-sectional view of a semiconductor package to which a pre-mold substrate according to an embodiment of the present disclosure is applied.
Figure 10:
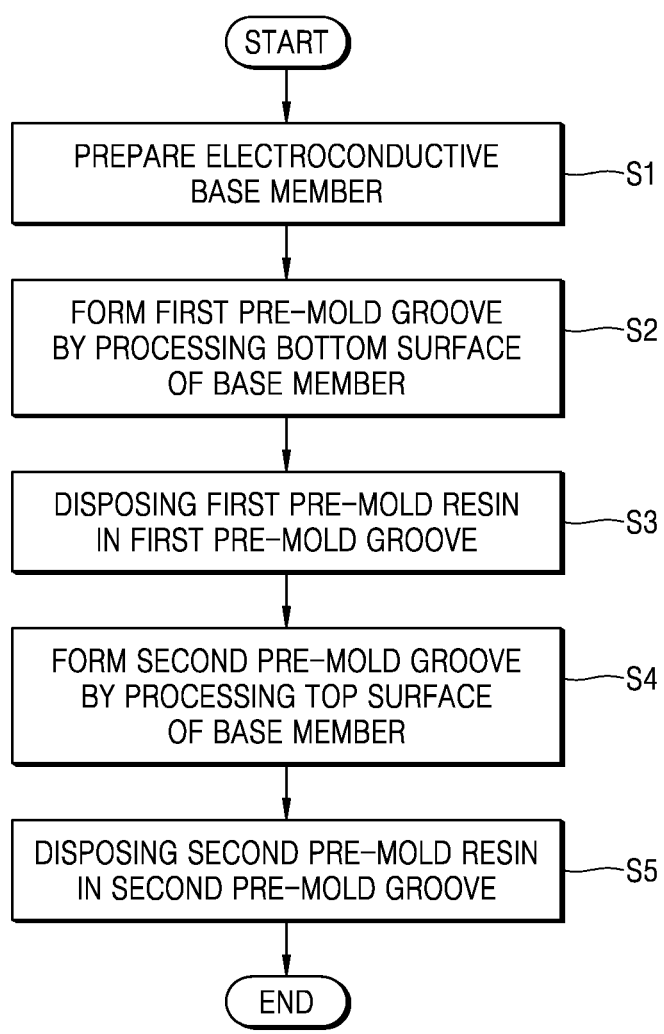
FIG. 10 is a flowchart schematically showing operations for manufacturing a pre-mold substrate according to an embodiment of the present disclosure.

FIGS. 2 to 8 are schematic cross-sectional diagrams sequentially showing operations for manufacturing a pre-mold substrate according to an embodiment of the present disclosure, FIG. 9 is a schematic cross-sectional view of a semiconductor package to which a pre-mold substrate according to an embodiment of the present disclosure is applied, and FIG. 10 is a flowchart schematically showing operations for manufacturing a pre-mold substrate according to an embodiment of the present disclosure.

Figure 2:
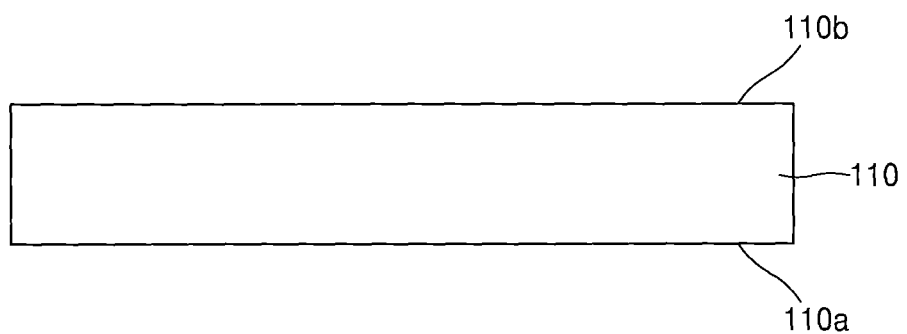
FIGS. 2 to 8 are schematic cross-sectional diagrams sequentially showing operations for manufacturing a pre-mold substrate according to an embodiment of the present disclosure.

First, as shown in FIG. 2, the base member 110 is prepared (operation S1). The base member 110 includes an electroconductive material and includes a bottom surface 110a and a top surface 110b.

Figure 3:
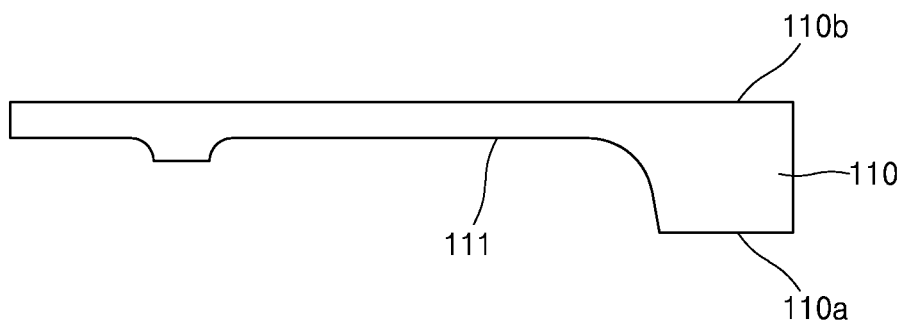

Next, as shown in FIG. 3, the first pre-mold groove 111 is formed by processing the bottom surface 110a of the base member 110 (operation S2).

Here, the bottom surface 110a of the base member 110 may be processed by using an etching method. The etching method may include wet etching and dry etching. In detail, for example, a dry film resist including a photosensitive material is disposed on the bottom surface 110a of the base member 110, and a resist pattern is formed from the dry film resist by exposing and developing the dry film resist. Next, the first pre-mold groove 111 may be formed by performing etching using the formed resist pattern.

Next, the first pre-mold resin 120 is applied and disposed in the first pre-mold groove 111 (operation S3).

Figure 4:
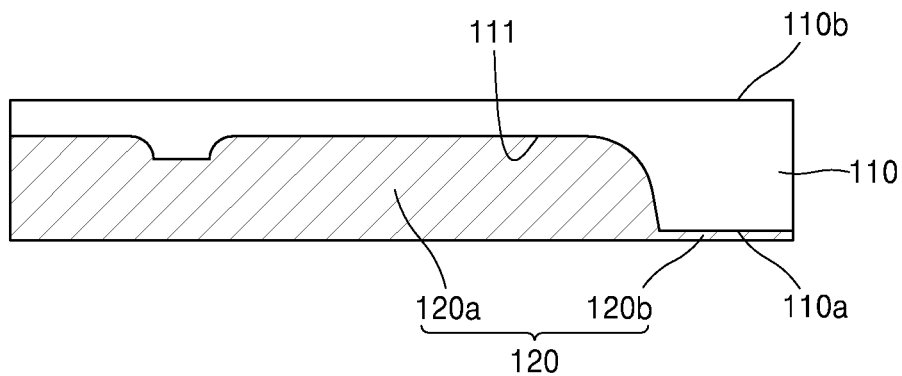
Figure 5:
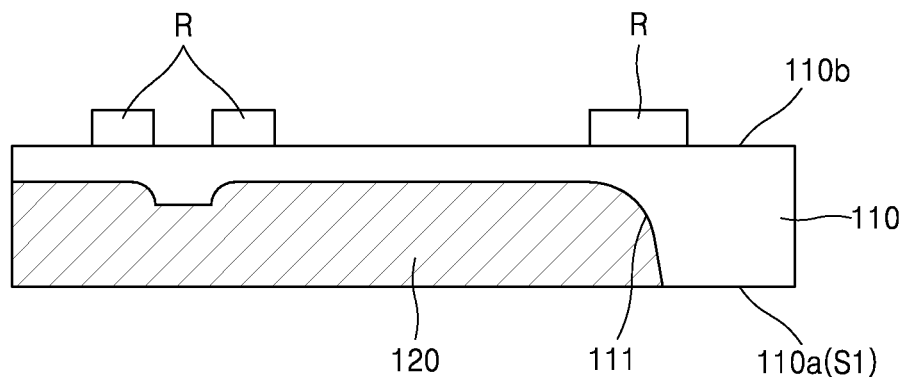

As shown in FIG. 4, the first pre-mold resin 120 may be formed to include not only a portion 120a located in the first pre-mold groove 111, but also a portion 120b covering a portion of the bottom surface 110a. In this case, as shown in FIG. 5, an exposed portion S1 may be formed by exposing the bottom surface 110a of the base member 110 through a brushing operation, a polishing operation, an etching operation, etc.

Next, the second pre-mold groove 112 is formed by processing the top surface 110b of the base member 110 (operation S4).

Here, the top surface 110b of the base member 110 may be processed by using an etching method. The etching method may include wet etching and dry etching.

Figure 6:
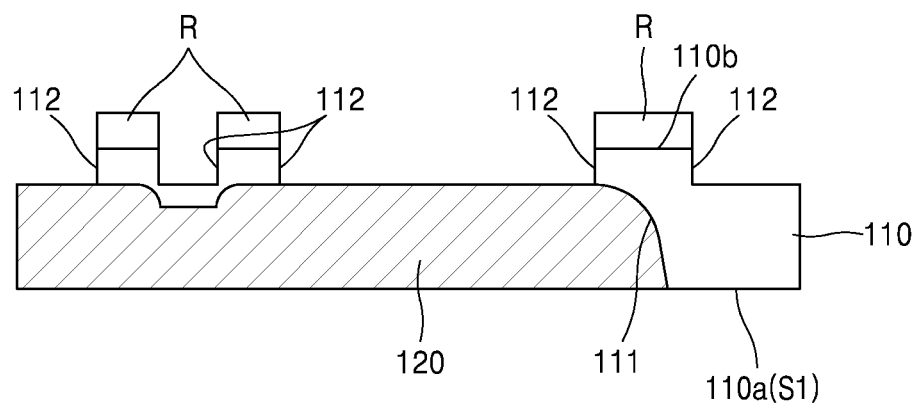

An example of a method of processing the top surface 110b of the base member 110 will be described below in detail. First, a dry film resist including a photosensitive material is disposed on the top surface 110b of the base member 110, and a resist pattern R is formed from the dry film resist by exposing and developing the dry film resist. Next, as shown in FIG. 6, the second pre-mold groove 112 is formed by performing etching using the formed resist pattern R.

Next, the second pre-mold resin 130 is applied and disposed in the second pre-mold groove 112 (operation S5).

As shown in FIG. 7, the second pre-mold resin 130 may be formed to include not only a portion 130a located in the second pre-mold groove 112, but also a portion 130b covering a portion of the top surface 110b. In this case, as shown in FIG. 8, an exposed portion S2 may be formed by exposing the top surface 110b of the base member 110 through a brushing operation, a polishing operation, an etching operation, etc.

The exposed portions S1 and S2 of the base member 110 that are not covered by the first pre-mold resin 120 and the second pre-mold resin 130 serve as terminals for electrical connection to a semiconductor chip or an external circuit board. Therefore, additional operations may be performed on the exposed portions S1 and S2. For example, at least portions of the exposed portions S1 and S2 may be plated by using Au or Pd or coated with an organic solderability preservative (OSP) for improved solder adhesion in later operations.

Meanwhile, when the pre-mold substrate 100 is manufactured, the pre-mold substrate 100 having the structure shown in FIG. 1 may be manufactured, and then the manufactured pre-mold substrate 100 may be transferred to a semiconductor package manufacturing process. However, the present disclosure is not limited thereto. In other words, in the process of manufacturing the pre-mold substrate 100, an operation of arranging a solder cream K at least portions of the exposed portions S1 and S2 of the base member 110 may be additionally performed as shown in FIG. 8. In other words, although an operation of arranging the solder cream K is generally performed during a semiconductor packaging process, as described above, the exposed portions S1 and S2 of the base member 110 serve as terminals for electrical connection, the solder cream K may be arranged at least portions of the exposed portions S1 and S2 during the process of manufacturing the pre-mold substrate 100. In this case, even though the solder cream K is flowable, the solder cream K remains on the exposed portions S1 and S2. The reason thereof is that, because the materials of the base member 110 and the first pre-mold resin(the second pre-mold resin 130) are different, surfaces of the first and second pre-mold resins 120 and 130 pull the solder cream K due to the characteristics of the materials constituting the first and second pre-mold resins 120 and 130, thereby preventing the solder cream K from being spread.

After the solder cream K is arranged, electrical connection between an electrode P of a semiconductor chip C and the base member 110 is performed by using the solder cream K in the process for manufacturing a semiconductor package. Next, encapsulation is performed by using a mold resin G like an epoxy-based material and a urethane-based material, thereby implementing the structure of a semiconductor package 200 as shown in FIG. 9.

According to the present embodiment, the electrical connection between the electrode P of the semiconductor chip C and the base member 110 is performed by directly using the solder cream K, but the present disclosure is not limited thereto. In other words, according to the present disclosure, an electrical connection to the semiconductor chip C may be performed by forming a bump by using the solder cream K.

The process of manufacturing the pre-mold substrate 100 according to the present embodiment as described above is performed in the order of forming the first pre-mold groove 111, disposing the first pre-mold resin 120, forming the second pre-mold groove 112, and disposing the second pre-mold resin 130. However, the present disclosure is not limited thereto. In other words, the process of manufacturing the pre-mold substrate 100 according to the present disclosure may be performed in the order of forming the second pre-mold groove 112, disposing the second pre-mold resin 130, forming the first pre-mold groove 111, and disposing the first pre-mold resin 120. Also, in process of manufacturing the pre-mold substrate 100 according to the present disclosure, first and second pre-mold resins may be arranged after first and second pre-mold grooves are formed first.

Although the process of manufacturing the pre-mold substrate 100 as described above is performed on one flat panel at a time, the present disclosure is not limited thereto. In other words, according to the present disclosure, the process of manufacturing the pre-mold substrate 100 as described above may be performed continuously as a roll-to-roll process.

As described above, in the pre-mold substrate 100 according to the present embodiment, because the first pre-mold groove 111 is formed in the bottom surface 110a of the base member 110, the second pre-mold groove 112 is formed in the top surface 110b of the base member 110, the first pre-mold resin 120 is disposed in the first pre-mold groove 111, and the second pre-mold resin 130 is disposed in the second pre-mold groove 112, pre-mold resins are arranged on both the bottom surface side and the top surface side of the base member 110. By having the structure, in the overall structure of the pre-mold substrate 100, a difference between thermal expansion coefficients of the bottom surface side and the top surface side of the pre-mold substrate 100 is small, and thus, warpage of the pre-mold substrate 100 may be prevented. In particular, according to the present embodiment, the first pre-mold resin 120 and the second pre-mold resin 130 include a resin of the same type, and thus, warpage of the pre-mold substrate 100 may be more effectively prevented.

Also, according to the present embodiment, when the solder cream K is arranged at the exposed portions S1 and S2 of the base member 110 during the process of manufacturing the pre-mold substrate 100 or the process of manufacturing the semiconductor package 200, it is possible to prevent the solder cream K from being spread because the materials of the base member 110 and the first pre-mold resin(the second pre-mold resin 130) are different, and thus, the quality of the semiconductor package 200 may be improved.

Although aspects of the present invention are described with reference to the embodiments illustrated in the accompanying drawings, they are merely examples, and one of ordinary skill in the art will understand that various modifications and other equivalent embodiments may be derived therefrom. Accordingly, the true scope of the present disclosure should be determined only by the appended claims.

INDUSTRIAL APPLICABILITY

A pre-mold substrate and a method of manufacturing the pre-mold substrate according to the present embodiment may be applied to industries manufacturing pre-mold substrates.

The invention claimed is:

1. A pre-mold substrate, comprising:
an electroconductive base member, which comprises a first pre-mold groove formed in a bottom surface and a second pre-mold groove formed in a top surface and constitutes a circuit pattern;
a first pre-mold resin disposed in the first pre-mold groove; and
a second pre-mold resin disposed in the second pre-mold groove, wherein:
 a bottom surface of a first portion of the electroconductive base member is coplanar with a surface of the first pre-mold resin;
 the first portion of the electroconductive base member has a respective height;
 a top surface of a second portion of the electroconductive base member is coplanar with the surface of the second pre-mold resin; and
 the second portion of the electroconductive base member has a respective height which is less than the respective height of the first portion of the electroconductive base member, wherein the first portion of the electroconductive base member comprises a step down from a height of the surface of the second pre-mold resin to a height of an interface between the first and second pre-mold resins.

2. The pre-mold substrate of claim 1, wherein the first pre-mold resin and the second pre-mold resin comprise a resin of the same type.

3. The pre-mold substrate of claim 1, wherein a solder cream is arranged at least portions of exposed portions of the electroconductive base member not covered by the first pre-mold resin and the second pre-mold resin.

4. The pre-mold substrate of claim 1, wherein:
a top surface of the first portion of the electroconductive base member is coplanar with the surface of the second pre-mold resin; and
the top surfaces of the first and second portions of the electroconductive base member comprise terminals.

5. The pre-mold substrate of claim 1, wherein the second portion of the electroconductive base member comprises portions which extend from the height of the surface of the second pre-mold resin to the height of the interface.

6. The pre-mold substrate of claim 1, wherein the second portion of the electroconductive base member comprises a portion which extends from the height of the interface to a height which is above the surface of the first pre-mold resin and below the height of the interface.

7. A method of manufacturing a pre-mold substrate, the method comprising:
preparing an electroconductive base member;
forming a first pre-mold groove by processing a bottom surface of the electroconductive base member;
disposing a first pre-mold resin in the first pre-mold groove;
processing the first pre-mold resin so that a surface of the first pre-mold resin is coplanar with the bottom surface of the electroconductive base member;
forming a second pre-mold groove by processing a top surface of the electroconductive base member;
disposing a second pre-mold resin in the second pre-mold groove; and
processing the second pre-mold resin so that a surface of the second pre-mold resin is coplanar with the top surface of the electroconductive base member, wherein:
 a bottom surface of a first portion of the electroconductive base member is coplanar with the surface of the first pre-mold resin;
 the first portion of the electroconductive base member has a respective height;
 a top surface of a second portion of the electroconductive base member is coplanar with the surface of the second pre-mold resin; and
 the second portion of the electroconductive base member has a respective height which is less than the respective height of the first portion of the electroconductive base member, wherein the first portion of the electroconductive base member comprises a step down from a height of the surface of the second pre-mold resin to a height of an interface between the first and second pre-mold resins.

8. The method of claim 7, wherein the first pre-mold resin and the second pre-mold resin comprise a resin of the same type.

9. The method of claim 7, wherein, in the forming of the first pre-mold groove, the bottom surface of the electroconductive base member is processed through etching.

10. The method of claim 9, wherein the etching is performed by disposing a dry film resist comprising a photosensitive material on the bottom surface of the electroconductive base member and forming a resist pattern from the dry film resist.

11. The method of claim 7, wherein, in the forming of the second pre-mold groove, the top surface of the electroconductive base member is processed through etching.

12. The method of claim 11, wherein the etching is performed by disposing a dry film resist comprising a photosensitive material on the top surface of the electroconductive base member and forming a resist pattern from the dry film resist.

13. The method of claim 7, further comprising arranging a solder cream at least portions of exposed portions of the electroconductive base member not covered by the first pre-mold resin and the second pre-mold resin.

14. The method of claim 7, wherein:
a top surface of the first portion of the electroconductive base member is coplanar with the surface of the second pre-mold resin; and
the top surfaces of the first and second portions of the electroconductive base member comprise terminals.

15. The method of claim 7, wherein the second portion of the electroconductive base member comprises portions which extend from the height of the surface of the second pre-mold resin to the height of the interface.

16. The method of claim 7, wherein the second portion of the electroconductive base member comprises a portion which extends from the height of the interface to a height which is above the surface of the first pre-mold resin and below the height of the interface.

* * * * *